(12) United States Patent
Turner

(10) Patent No.: US 9,534,298 B2
(45) Date of Patent: Jan. 3, 2017

(54) ETCHING TRAY AND LID FOR ACID ETCHING PCD CUTTING INSERTS

(71) Applicant: Stingray Group, LLC, Layton, UT (US)

(72) Inventor: Allen Turner, Layton, UT (US)

( * ) Notice: Subject to any disclaimer, the term of this patent is extended or adjusted under 35 U.S.C. 154(b) by 335 days.

(21) Appl. No.: 14/055,628

(22) Filed: Oct. 16, 2013

(65) Prior Publication Data

US 2015/0101753 A1   Apr. 16, 2015

(51) Int. Cl.
| H01L 21/67 | (2006.01) |
| B22F 5/00 | (2006.01) |
| B22F 3/24 | (2006.01) |
| C23F 1/08 | (2006.01) |
| C23F 1/02 | (2006.01) |
| C22C 26/00 | (2006.01) |

(52) U.S. Cl.
CPC .. *C23F 1/02* (2013.01); *B22F 3/24* (2013.01); *B22F 2003/244* (2013.01); *B22F 2005/001* (2013.01); *B22F 2999/00* (2013.01); *C22C 26/00* (2013.01); *C23F 1/08* (2013.01); *H01L 21/6708* (2013.01); *H01L 21/67017* (2013.01); *H01L 21/67086* (2013.01)

(58) Field of Classification Search
CPC ......... B22F 2999/00; B22F 3/24; B22F 3/003; B22F 2003/244; B22F 2005/001; C22C 26/00; C23F 1/02; C23F 1/08; E21B 10/46
USPC ........................................ 156/345.18, 345.11
See application file for complete search history.

(56) References Cited

U.S. PATENT DOCUMENTS

| 1,411,868 | A | * | 4/1922 | Myers ............................. 232/43 |
| 3,136,323 | A | * | 6/1964 | Martz et al. .................. 134/94.1 |
| 3,426,791 | A | * | 2/1969 | Nelson .................... B64G 1/402 137/582 |
| 3,986,610 | A | | 10/1976 | Hawn |
| 4,084,080 | A | * | 4/1978 | McMahan ...................... 219/401 |
| 4,098,398 | A | * | 7/1978 | Meyers .................... B65D 5/46 141/340 |
| 4,475,665 | A | * | 10/1984 | Norton ........................... 222/14 |
| 4,475,977 | A | * | 10/1984 | Dunn ......................... 156/345.11 |
| 7,558,369 | B1 | | 7/2009 | Mourik et al. |
| 7,616,734 | B1 | | 11/2009 | Corbett et al. |
| 7,649,173 | B2 | | 1/2010 | Hu et al. |
| 7,801,268 | B1 | | 9/2010 | Mourik et al. |

(Continued)

FOREIGN PATENT DOCUMENTS

| JP | 2004028787 | 6/2002 |
| JP | 2012132826 | 12/2010 |
| JP | 2014041030 | 8/2012 |

*Primary Examiner* — Gordon R Baldwin
*Assistant Examiner* — Mirza Israr Javed
(74) *Attorney, Agent, or Firm* — Pate Peterson PLLC; Brett Peterson

(57) ABSTRACT

An etching tray for etching PCD cutting inserts is provided. The etching system includes a tray having a bottom and side walls extending upwardly from the tray bottom and a lid attachable to the top of the tray. The lid may include a funnel formed as an integral part of the lid which has an upper opening disposed above the lid and a lower neck which extends into the tray. The lid may also include an opening for a float to pass through and provide a visual indication of the liquid level in the tray. An etching fixture may be disposed in the tray for etching cutting inserts. The etching fixture has a body which holds a cutting insert to expose the cutting insert for etching.

15 Claims, 15 Drawing Sheets

(56) References Cited

U.S. PATENT DOCUMENTS

| | | |
|---|---|---|
| 7,864,919 B1 | 1/2011 | Eyre et al. |
| 8,014,492 B1 | 9/2011 | Corbett et al. |
| 8,130,903 B2 | 3/2012 | Corbett et al. |
| 8,147,572 B2 | 4/2012 | Eyre et al. |
| 2007/0169419 A1 | 7/2007 | Davis et al. |
| 2007/0284152 A1 | 12/2007 | Eyre et al. |
| 2010/0011673 A1 | 1/2010 | Shamburger |
| 2010/0012391 A1 | 1/2010 | Shamburger |
| 2011/0056141 A1 | 3/2011 | Miess et al. |
| 2011/0250498 A1* | 10/2011 | Green et al. ............ 429/218.1 |
| 2012/0048468 A1* | 3/2012 | Turner et al. ............ 156/345.51 |
| 2014/0115971 A1 | 5/2014 | Sani et al. |

* cited by examiner

US 9,534,298 B2

ETCHING TRAY AND LID FOR ACID ETCHING PCD CUTTING INSERTS

THE FIELD OF THE INVENTION

The present invention relates to acid etching of polycrystalline diamond compact cutting inserts. More specifically, the present invention relates to an etching tray and lid for the acid etching of polycrystalline diamond (PCD) inserts used in drill bits and industrial cutters.

BACKGROUND

PCD may be used to make cutting inserts as it provides a durable cutting edge. For example, PCD cutting inserts may be used as the cutting tips on underground drill bits, such as those used to drill oil and gas wells. Such drill bit inserts are cylindrical in nature, having a cylindrical core or substrate which is typically sintered carbide and a layer of sintered polycrystalline diamond located on an end of the substrate cylinder. Multiple of such inserts are attached to drill bits as the PCD forms a durable cutting edge. PCD cutting inserts may be used in a variety of applications to provide a higher performing and longer lasting cutting solution.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
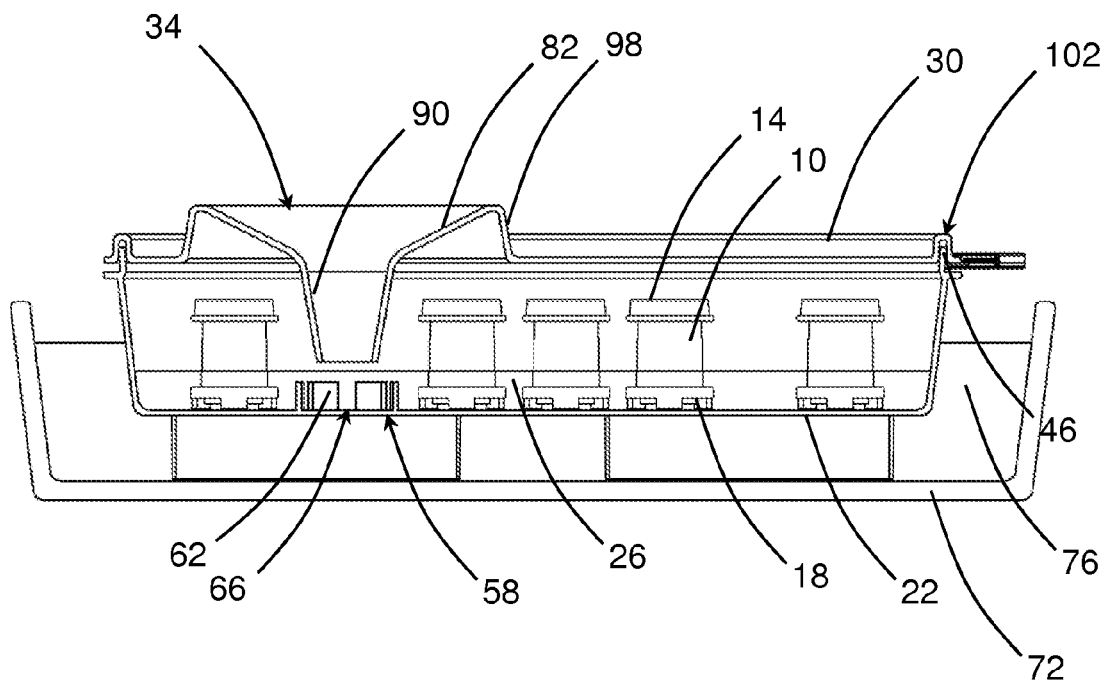
FIG. 1 shows a cross sectional view of an etching system.

It will be appreciated that the drawings are illustrative and not limiting of the scope of the invention which is defined by the appended claims. The embodiments shown accomplish various aspects and objects of the invention. It is appreciated that it is not possible to clearly show each element and aspect of the invention in a single figure, and as such, multiple figures are presented to separately illustrate the various details of the invention in greater clarity. Similarly, not every embodiment need accomplish all advantages of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

While PCD cutting inserts provide a durable cutting edge, the solvent metal (sintering metal) which occupies the interstitial spaces between the diamond crystals can cause degradation of the insert during use. In the sintered diamond, the diamond often accounts for about 85 to 95 percent of the PCD, and the remaining material is a metal which acts as a solvent for carbon and a catalyst for diamond formation while sintering the PCD. The fraction of solvent metal is sufficient to cause problems while using the PCD cutting insert. One problem is that the solvent metal expands more with temperature than diamond, and can cause cracking of the PCD layer as the cutting insert is used. Another limitation is that the solvent metal, being a solvent for carbon during the formation of diamond crystals, also acts as a carbon solvent for the degradation of the diamond at elevated temperatures. As such, the solvent metal remaining in the PCD causes the diamond to convert into carbon dioxide, carbon monoxide, or graphite at temperatures near 700 degrees Celsius. As such, it is desirable to remove the solvent metal from the PCD cutting inserts before use in many cutting applications. The solvent metal may be etched from the PCD using a mixture of strong acids, such as hydrofluoric and nitric acids (HF and $HNO_3$).

Referring to FIG. 1, an example system for etching PCD cutting inserts is shown. The system may include an etching fixture 10 and a cap or lid 14 which are used to hold a PCD insert 18 for etching. For an example cutting insert 18 used for rock drill bits, the PCD insert 18 is typically cylindrical and includes a cylindrical sintered carbide body (substrate) with a layer of sintered diamond on an end of the carbide body. The insert substrate is typically sintered carbide which is a sintered mixture of metal carbides and sintering metals. The PCD layer is typically sintered diamond and may include about 85 to 95 percent diamond crystals and the remainder an appropriate solvent catalyst metal which is active in sintering diamond at high temperature and pressure. The insert 18 is typically a cylindrical shape, and includes a circular cross section and may include flat ends. The PCD layer is typically a round disk shape and is bonded to an end of the substrate.

While etching such a cutting insert 18, it is typically desirable to etch the PCD layer without etching the carbide body. The etching fixture 10 and lid 14 are used to protect the carbide body and expose a desired amount of the PCD layer for etching. The PCD insert 18 is inserted into the fixture 10 so that a portion of the diamond layer protrudes from the bottom of the fixture and the exposed end of the PCD insert can be etched. For a cylindrical cutting insert 18, the fixture 10 may have a body which is generally cylindrical, and has a bore therethrough. The bore is sized to receive a PCD insert 18. A sealing element such as a small rib is formed at the bottom of the bore. The rib seals against an insert 18 which is pressed through the top of the bore, through the lower end of the bore and past the rib by a desired amount.

The fixture 10 may include a base formed at the bottom of the body. The base may extend radially outwardly from the bottom of the body. A plurality of feet may extend downwardly from the base. The feet may be used to elevate the base and the insert 18 which is being etched so that the insert 18 is held off of the bottom of the etching tray 22 and to allow for better circulation of the acid 26 around the PCD insert 18.

A cap 14 is placed on the fixture 10. A cap 14 may be used to close a fixture and prevent acid 16 from contacting a part of a cutting insert 18 which is not intended to be etched. Once assembled, the fixture 10 (with insert 18) is placed into an etching tray 22 for etching. The fixture 10 typically holds the PCD insert 18 off of the surface of the etching tray 22 to allow acid 26 to circulate around the insert 18 and facilitate etching the PCD insert. In this manner, the fixtures 10 hold a cutting insert 18 to facilitate etching of the insert. The fixtures 10 typically expose a portion of the insert for etching while protecting a portion of the insert from etching. The fixtures 10 also typically position the inserts 18 to allow good acid circulation around the inserts 18. Typically, the tray 22 holds a number of fixtures 10 for etching so that many inserts 18 can be etched in a single batch.

Once the fixtures 10 are loaded into the etching tray 22, a lid 30 is attached to the tray 22. The lid 30 is designed to allow acid 26 to be placed into the tray 22 while the lid is attached to the tray. This allows for easier handling and maintenance of the etching system while it is in use. A person may fill the etching tray 22 with etching fixtures 10, close the lid 30, and place the etching tray 22 in a desired location for etching before filling the tray 22 with acid 26. This reduces the risk of spillage or acid burns while handling the etching tray 22.

Figure 2:
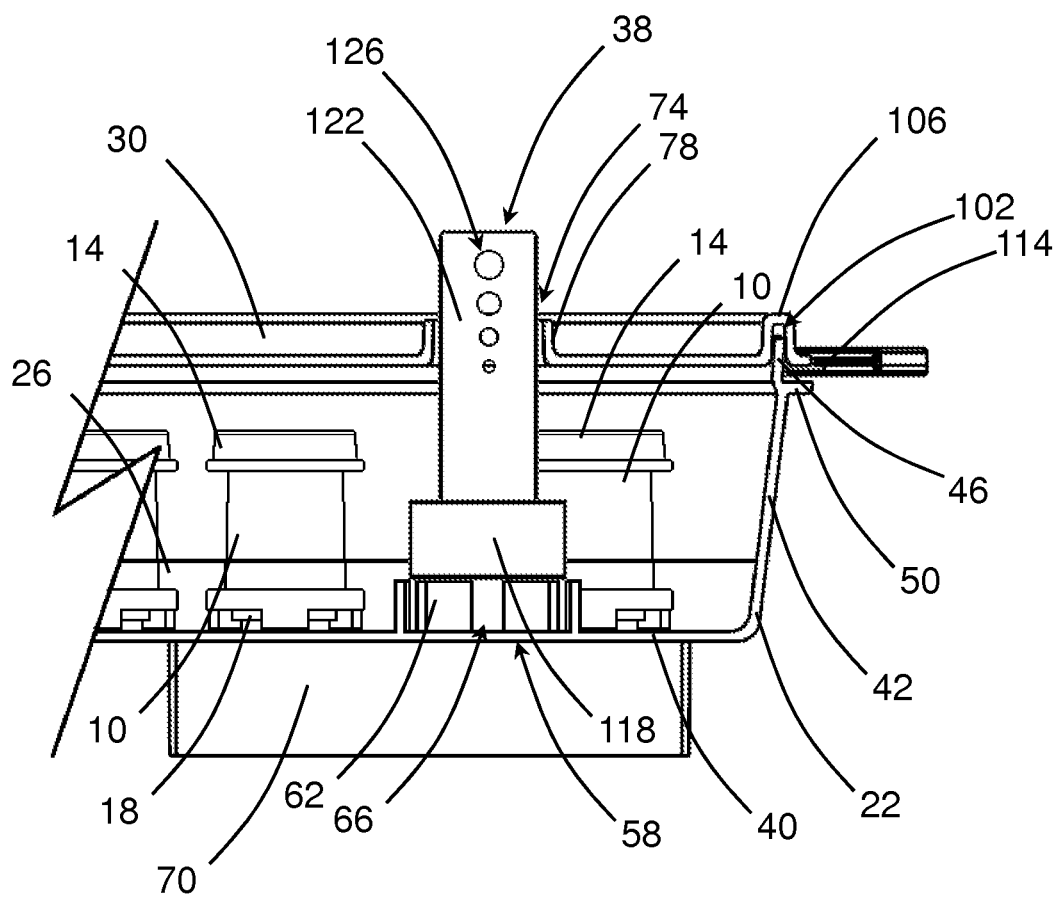
FIG. 2 shows another cross sectional view of part of the etching system.

The lid 30 may include a funnel 34 which is molded as an integrated part of the lid 30. Concentrated acid 26 may be poured into the etching tray 22 through the funnel 34 so that the acid 26 covers the bottom of the fixtures 10 and the exposed part of the PCD insert 18. The lid 30 may also include a float assembly 38 (FIG. 2) which extends through an opening in the lid and allows a user to easily see the acid level in the tray 22. A user may replenish the acid level as necessary while etching and maintain a consistent level of acid 26 in the tray 22. The acid 26 may be kept at a desired temperature for a desired time period to etch metal from the sintered diamond PCD insert 18. The inserts 18 may be etched for a long period of time, and may sometimes be etched for a period of 5 to 10 days in order to remove the solvent metal from the sintered diamond to a desired depth.

The tray 22 and lid 30 may be formed from a polymer plastic such as polypropylene, polyethylene, polyvinylidene fluoride, polyvinylidene difluoride, polytetraflouroethylene, and mixtures thereof. Other suitable plastics are Liquid Crystal Polymer (LCP) or PolyEtherKetone (PEK). An example of a suitable material is C3350 TR polypropylene co-polymer. In one example, the tray 22 may be formed from polyvinylidene diflouride and the lid 30 may be formed from polyethylene.

Figure 3:
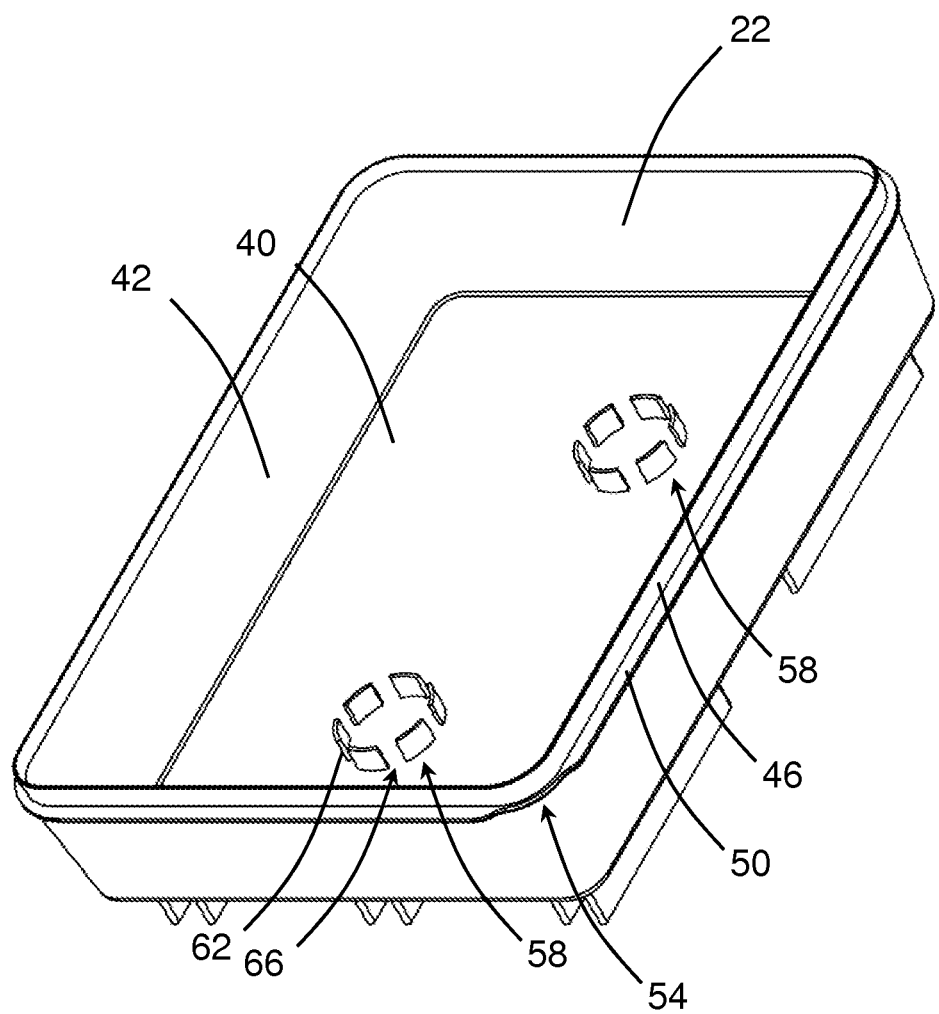
FIGS. 3 through 8 show the etching system tray.
Figure 4:
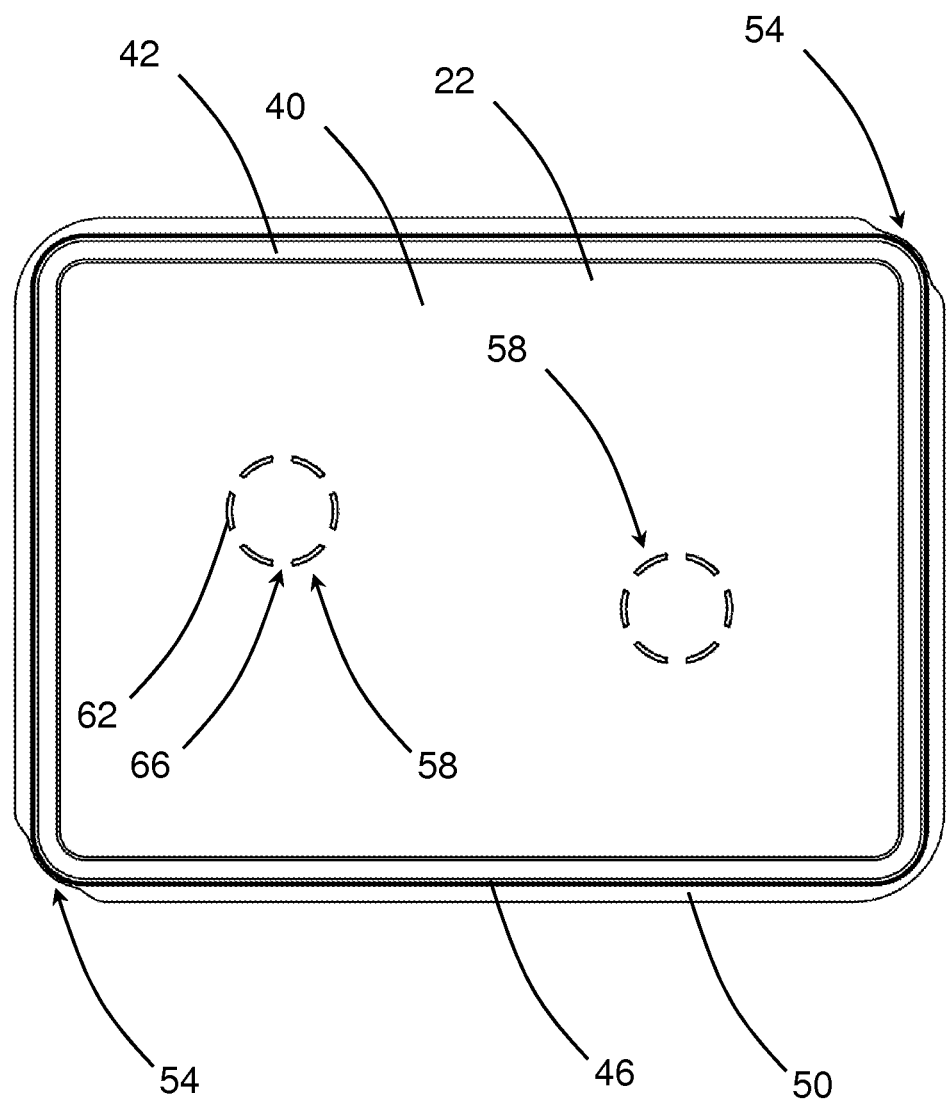

Referring to FIGS. 3 and 4, top perspective and top views of the tray 22 are shown. The tray 22 is rectangle, but other configurations may be used. The tray 22 includes a bottom 40 and side walls 42 which extend up from the bottom and define the interior of the tray. The top of the side walls 42 may define an upper sealing edge 46 which engages the lid 30 to attach the lid to the tray 22 and form a liquid-tight seal. The top of the side walls 42 may also include a reinforcing rib 50 which extends laterally from the side walls 42 and around the exterior of the side walls 42 to strengthen the tray 22. If desired, the rib 50 may include notches 54 which allow a user to more easily remove the lid 30 from the tray 22.

Spacer walls 58 may be formed inside of the tray 22 on the tray bottom 40. The tray 22 may include two spacer walls 58. The spacer walls 58 may have openings therethrough to allow liquid to pass through the spacer walls 58. Each spacer wall may be formed from wall segments 62 with openings 66 formed between adjacent wall segments 62. The spacer walls 58 may be located beneath the funnel 34 and the float assembly 38. The spacer walls 58 may prevent etching fixtures 10 from moving beneath the funnel or float and blocking the operation of the funnel or float. The spacer walls 58 may be located in rotationally symmetric locations relative to the center of the tray 22 (i.e. one spacer wall 58 is located up and left from the center of the tray while the other spacer wall 58 is located the same distance right and down from center). The funnel 34 and float assembly 38 may be located in corresponding locations, allowing the lid 30 to be rotated 180 degrees during installation without changing the functionality of the lid. In loading the tray 22, fixtures 10 may be placed across the tray bottom 40 outside of the spacer walls 58.

Figure 5:
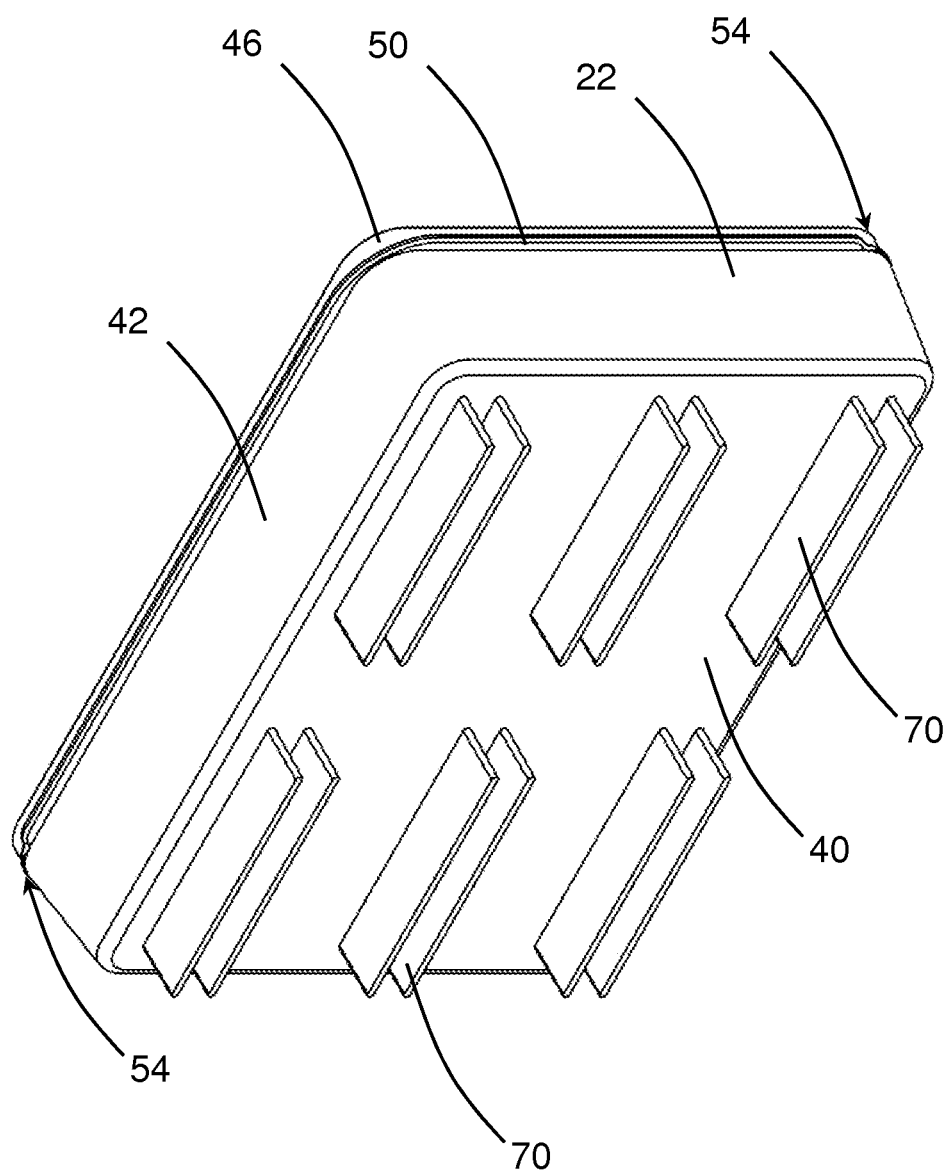
Figure 6:
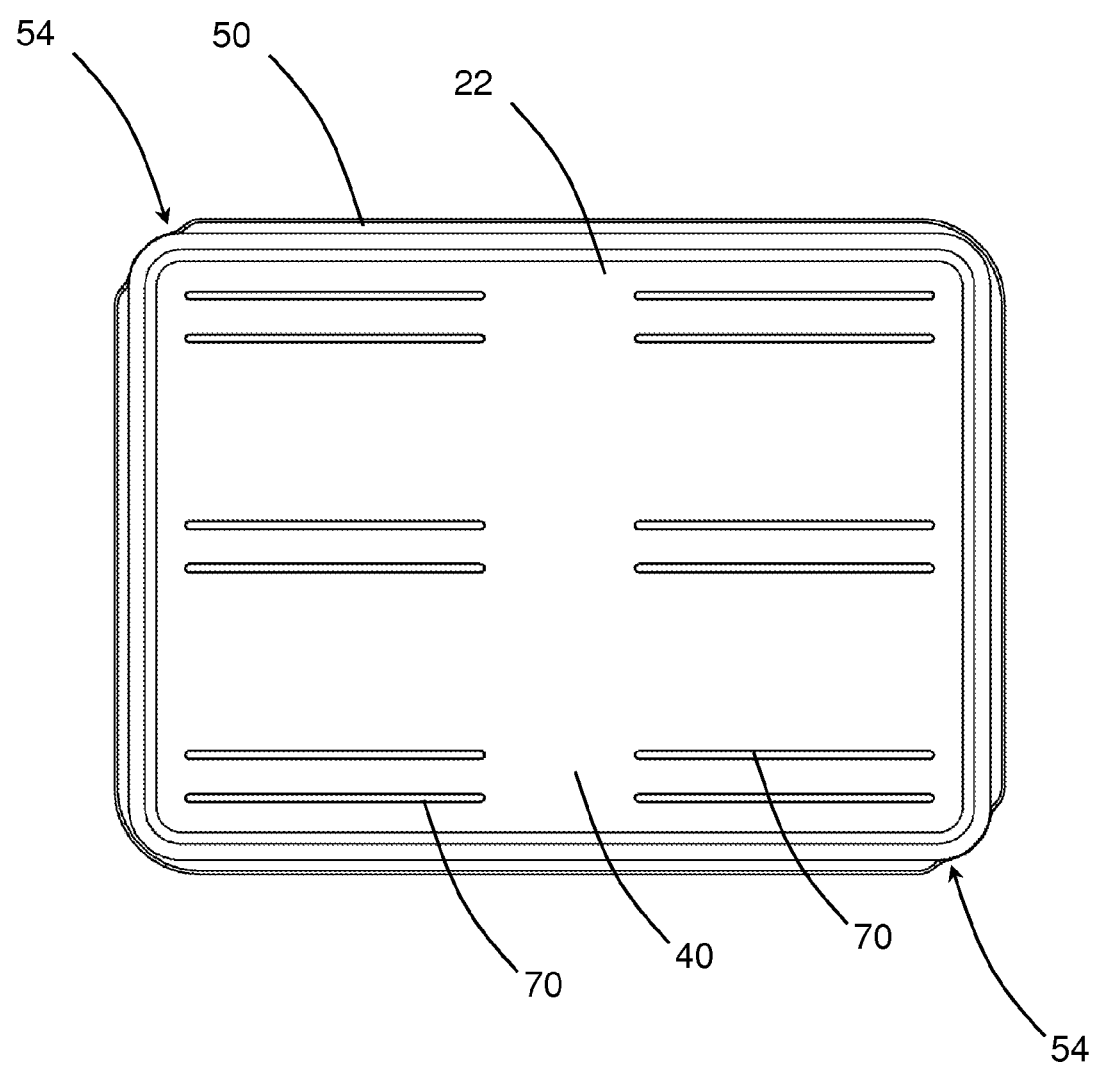

Referring to FIGS. 5 and 6, bottom perspective and bottom views of the tray 22 are shown. The tray 22 may include feet 70 located thereon. The feet 70 may be ribs or vertical posts or walls extending down from the bottom 40 of the tray 22. Multiple feet 70 may be located across the tray bottom 40 to provide support for the tray 22 and the tray contents. The etching tray 22 may be used with a heater (heating tray or well 72, FIG. 1) to maintain the acid 26 at a desired elevated temperature during etching as elevated temperature may speed up the etching process. The feet 70 may permit heating fluid (76, FIG. 1) to circulate between the heater and the tray 22 to evenly heat the tray. The heating fluid may be air, a liquid, etc. and may be used to provide an even temperature in the tray 22. The use of a tray 22 with feet 70 in combination with a heater 72 and heating fluid 76 allow for a controlled etching of a cutting insert at an elevated temperature.

Figure 7:
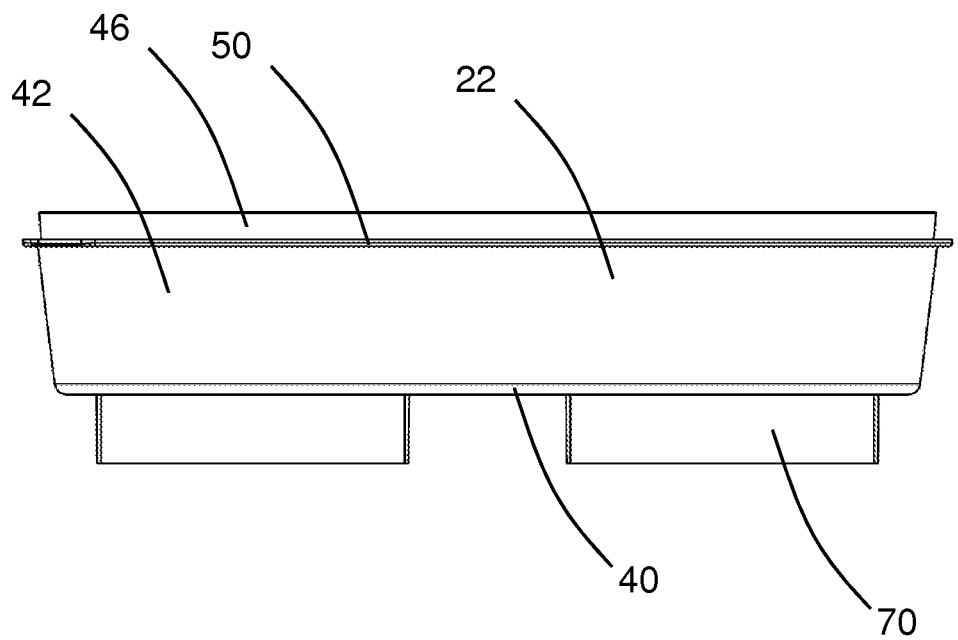
Figure 8:
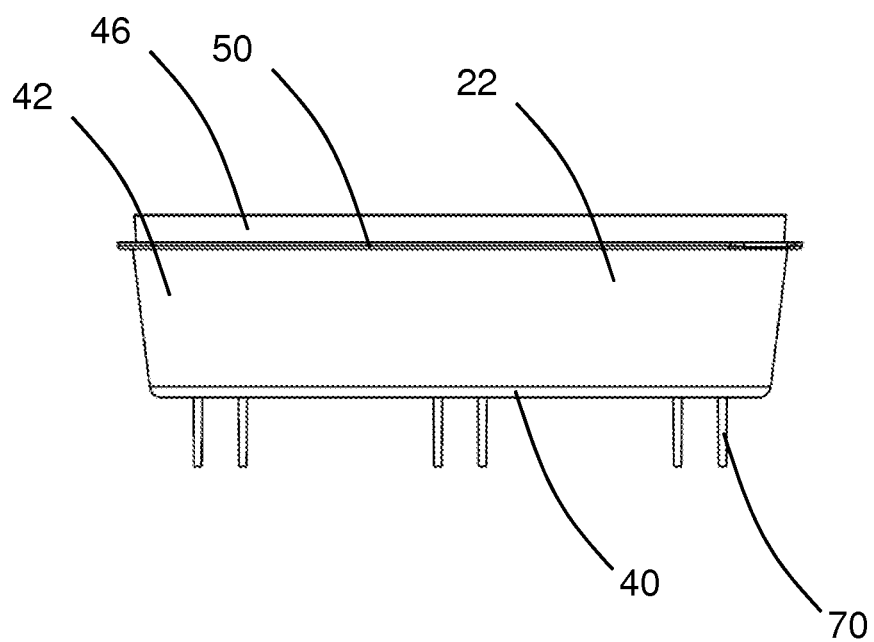

Referring to FIGS. 7 and 8, side and end views of the tray 22 are shown. The tray 22 may be rotationally symmetric so that the left and right sides of the tray 22 are the same. Similarly, the two opposing ends may be the same. This symmetry reduces user error in installing the lid 30.

Figure 9:
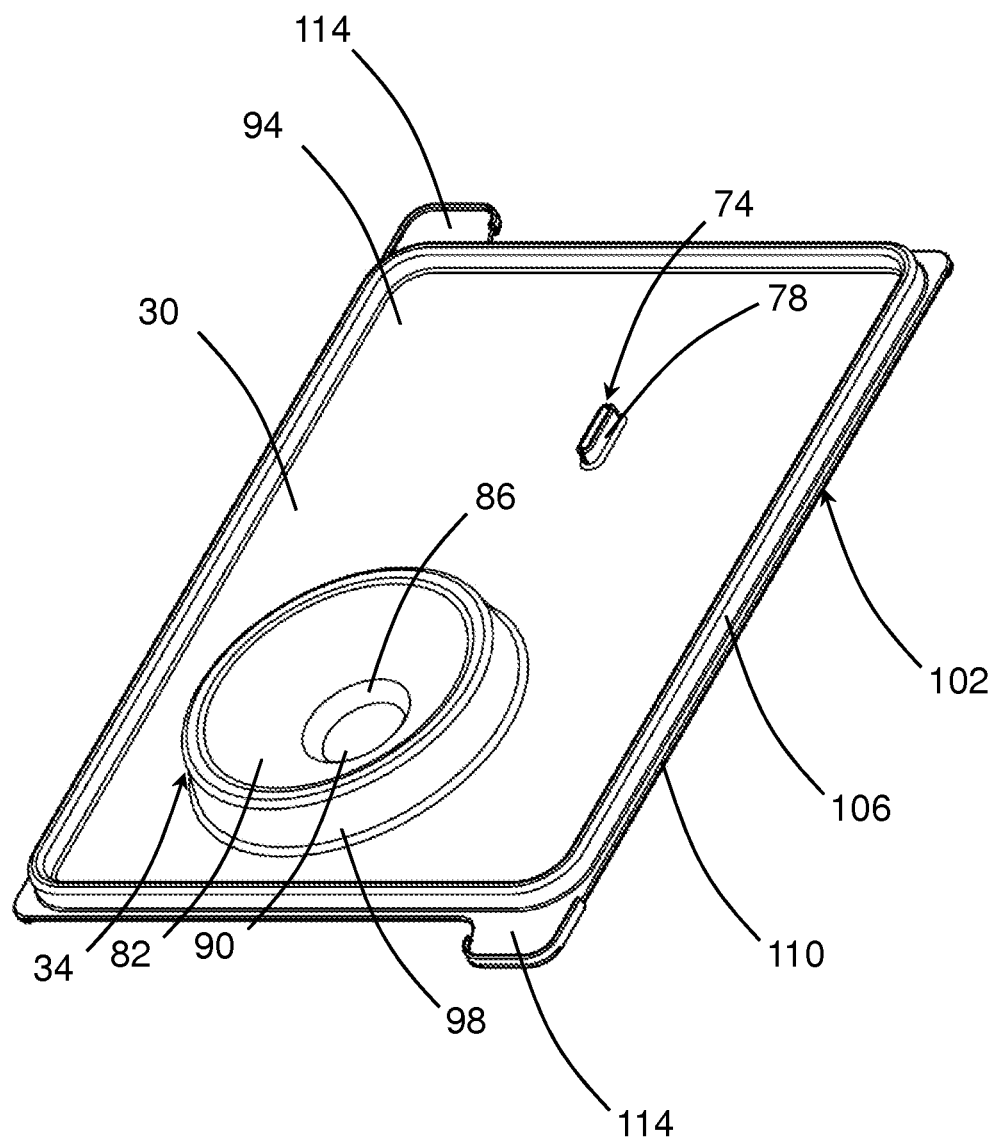
FIGS. 9 through 16 show the etching system lid.
Figure 10:
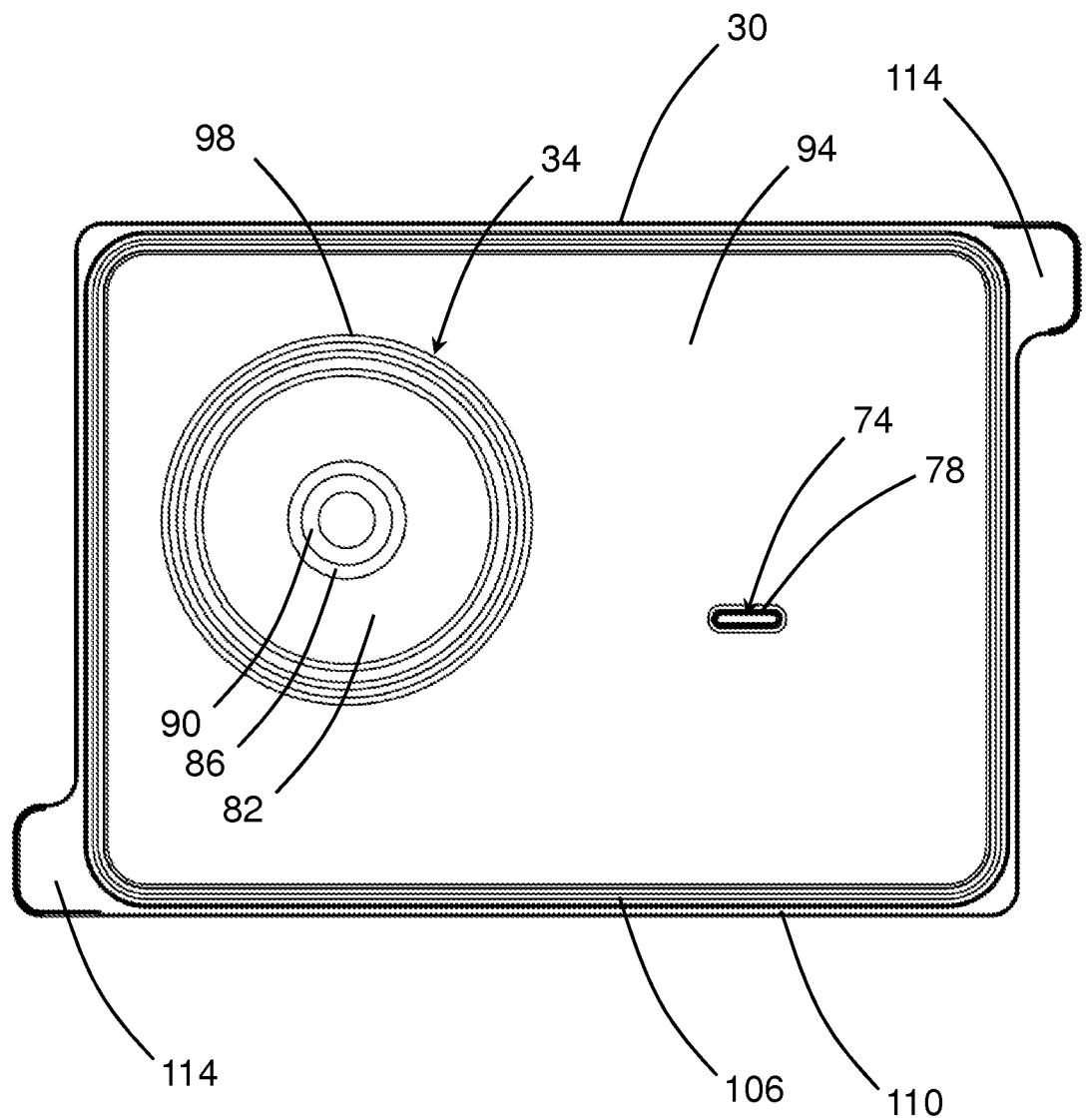

Referring to FIGS. 9 and 10, upper perspective and top views of the lid 30 are shown. The lid 30 may include a funnel 34 and an opening 74 for a float assembly 38 formed as part of the lid. As discussed, the funnel 34 and float opening 74 may be located in radially symmetric locations so that the center of the funnel is a distance left and up from the center of the lid and the float opening 74 is the same distance right and down from the center of the lid, ensuring that the funnel 34 and float assembly 38 are located over the spacer walls 58 when the lid 30 is placed on the tray 22.

The float opening 74 may be formed by a wall 78 extending vertically from the lid 30. The wall 78 creates an opening 74 which extends vertically between the wall 78, defining a vertical channel which guides the float assembly 38 and helping to keep the float in a desired orientation.

The funnel 34 may include a broad upper section 82 which transitions 86 into a narrower neck 90. The broad upper section 82 of the funnel provides a large opening into which acid 26 can be poured. The broad upper section 82 of the funnel 34 may include a shoulder or ridge extending around the perimeter of the upper section 82 to provide additional protection against splashing and to allow a person to more easily add liquid to the tray 22. The neck 90 is relatively narrow and tall. The neck 90 extends down into the tray 22, reducing splashes when acid 26 is poured into the tray 22. The upper section 82 of the funnel 34 may be sloped towards the neck at a shallower angle (i.e. closer to horizontal). The neck 90 can be sloped at a steep angle (i.e.

near vertical) to reduce splashes. For example, the upper section 82 of the funnel 34 may be sloped at an angle of approximately 30 degrees from horizontal and the funnel neck 90 may be sloped at an angle of approximately 80 degrees from horizontal The funnel 34 may be elevated from the upper surface 94 of the lid 30 by a wall 98. The wall 98 spaces the upper edge of the funnel above the upper surface of the lid 30. In one example, the wall 98 places the upper section 82 of the funnel 34 above the upper surface 94 (generally flat middle section) of the lid. This allows for a taller neck 90 without compromising the position of the neck within the tray 22. The wall 98 allows a broad funnel upper section 82 to be used without this upper section interfering with the placement of etching fixtures 10 inside of the tray 22. The neck 90 occupies a space within the tray 22 which is similar to one etching fixture 10.

The lid 30 has a sealing channel or groove 102 formed around the outside edge of the lid upper surface 94. The sealing channel 102 extends upwardly into the bottom of the lid 30. The channel 102 may be defined by a ridge 106 formed around the upper surface 94. The ridge 106 may extend up, outwardly, and down around the channel 102. A reinforcing rib 110 may extend around the ridge 106 and strengthen the lid 30 around the channel 102. Tabs 114 may be located around the lid 30. Two tabs 114 may be located adjacent the notches 54 to allow a person to more easily remove the lid 30 from the tray 22.

Figure 11:
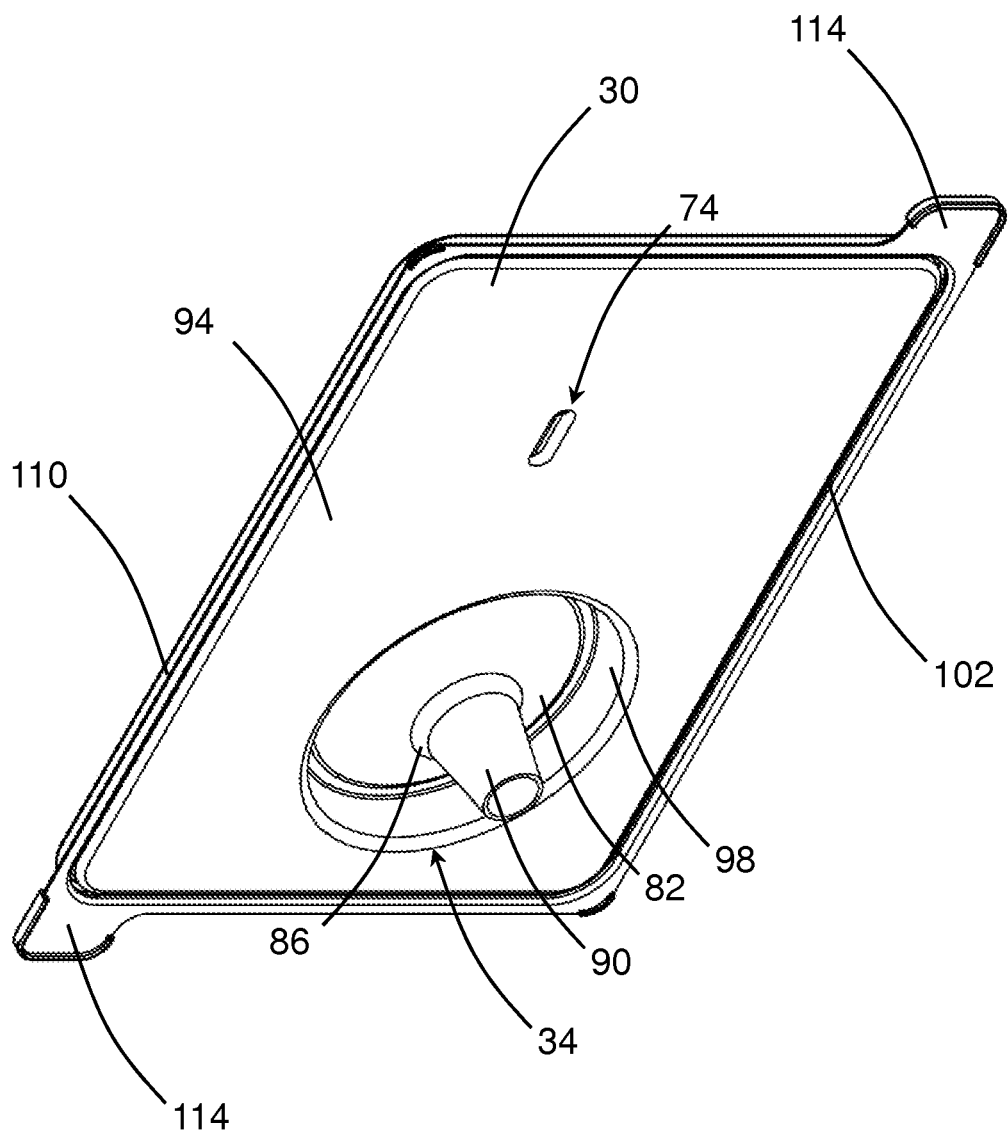
Figure 12:
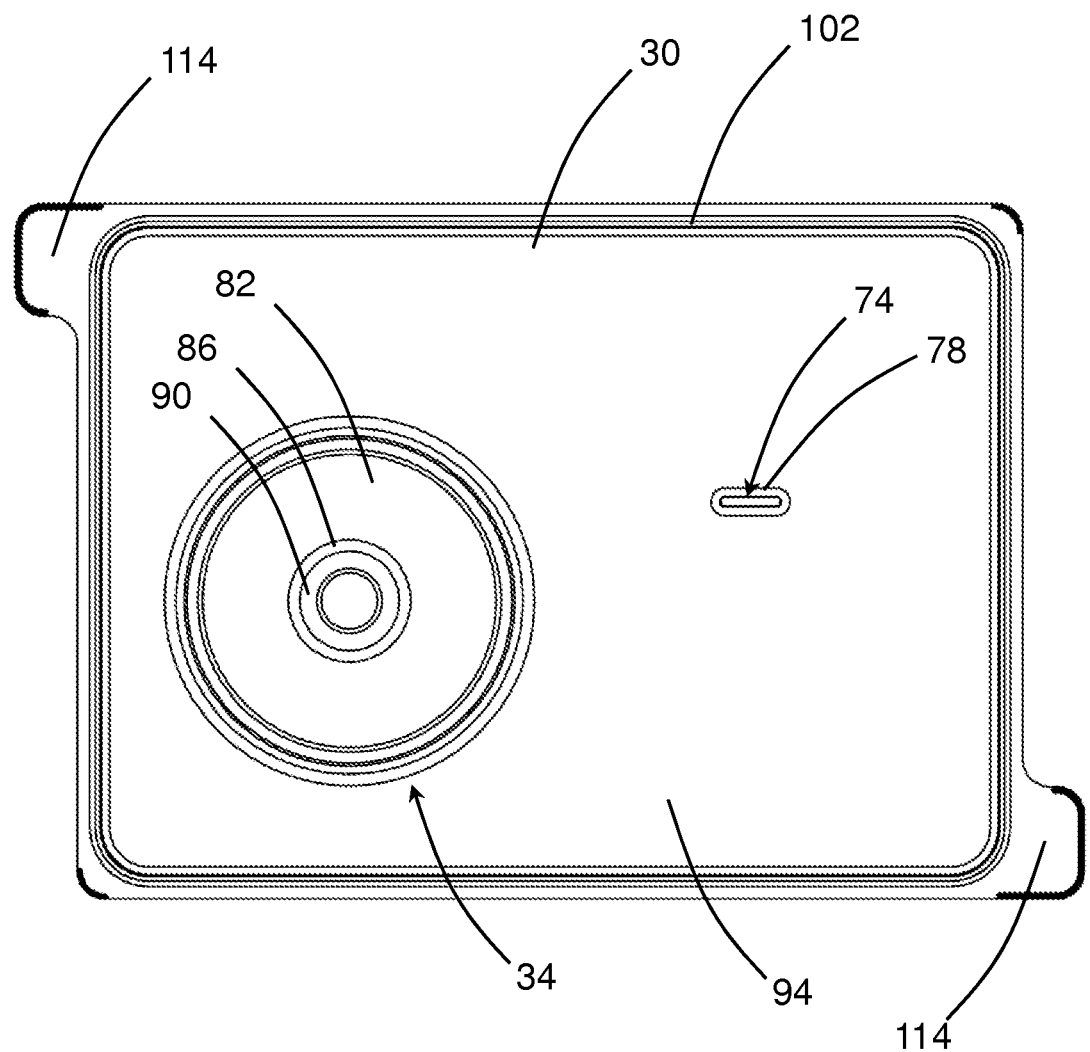

Referring now to FIGS. 11 and 12, bottom perspective and bottom views of the lid 30 are shown. The channel 102 extends around the perimeter of the lid 30 and has a size and shape corresponding to the upper sealing edge 46 of the tray 22. If desired, the channel 102 may include inside and outside walls which engage the inside and outside surfaces of the upper sealing edge 46 of the tray 22. The channel 102 may be formed with internal sealing ridges which assist in sealing between the lid 30 and tray 22 if desired. FIG. 11 illustrates how the funnel 34 is elevated above the upper surface 94 of the lid 30.

Figure 13:
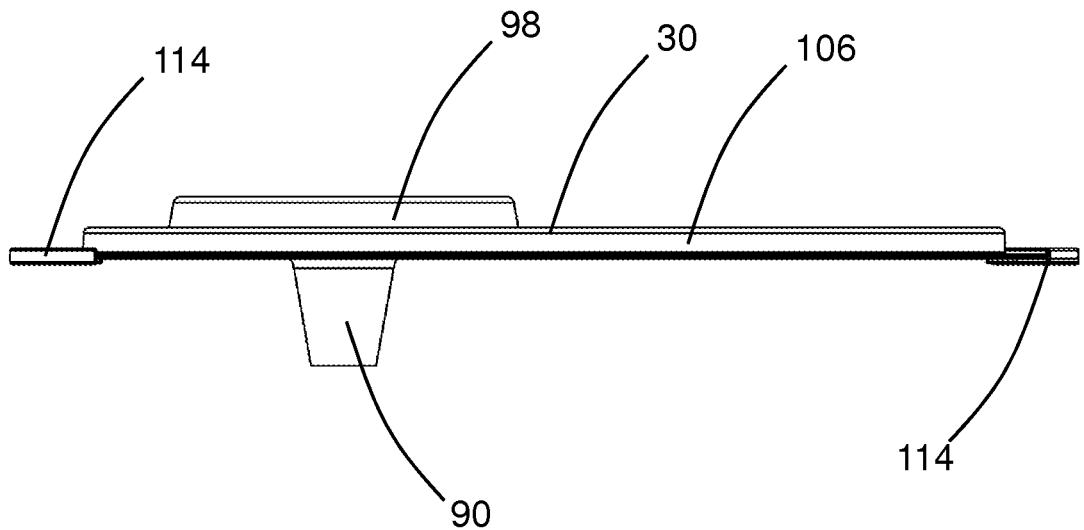
Figure 14:
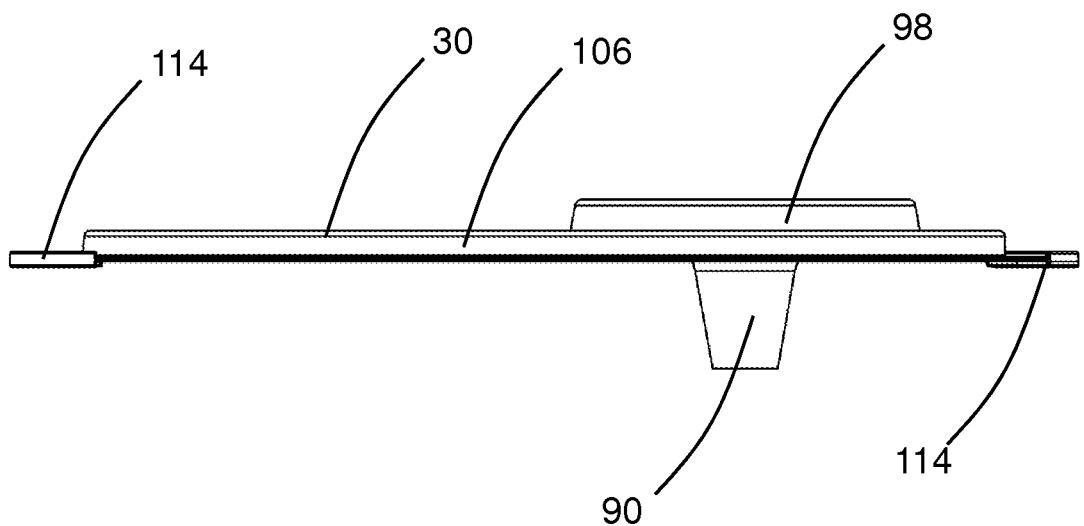
Figure 15:
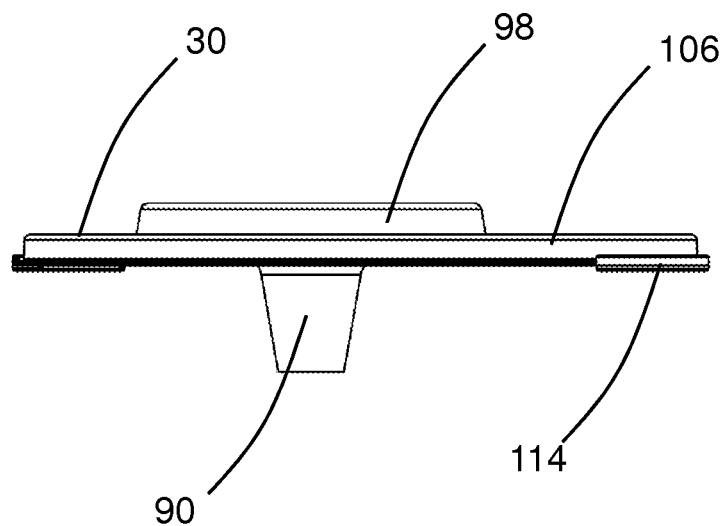
Figure 16:
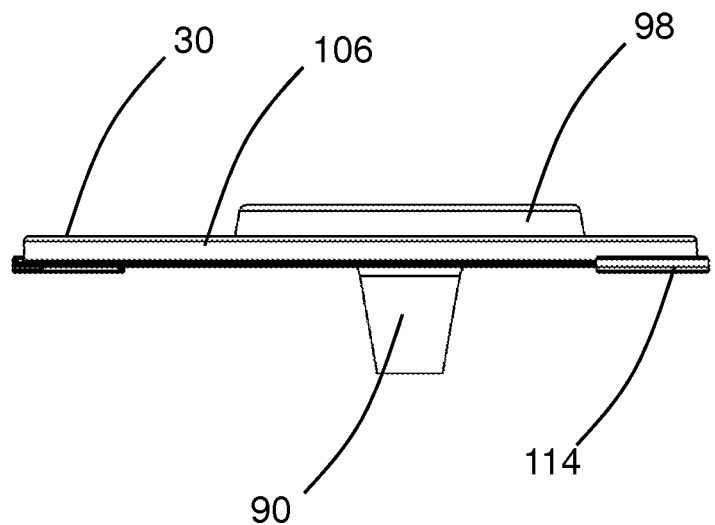

Referring now to FIGS. 13 and 14, front and back side views of the lid 30 are shown. FIGS. 15 and 16 show left and right end views of the lid 30. These views also illustrate how the funnel 34 is elevated above the upper surface 94 of the lid 30. The wider upper section 82 of the funnel is located above the plane of the lid 30 while the narrow neck 90 is located below the plane of the lid. This allows the lid 30 to have a funnel 34 with a broad opening without overly encroaching on the interior volume of the tray 22.

Figure 17:
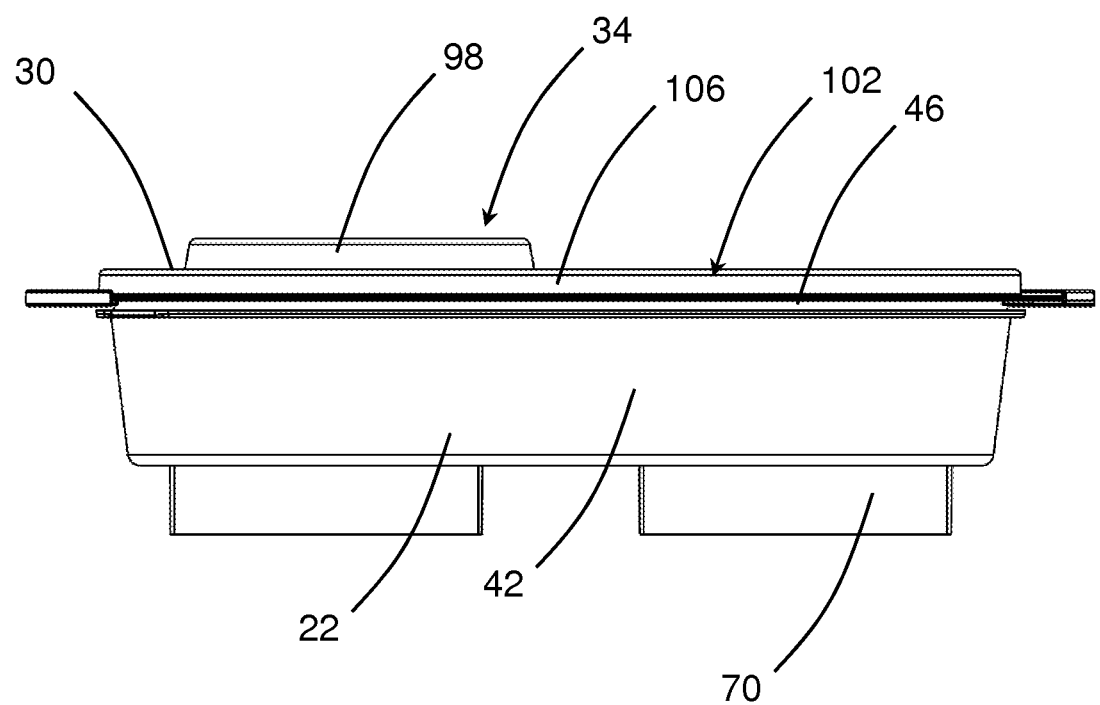
FIGS. 17 and 18 show the etching system.
Figure 18:
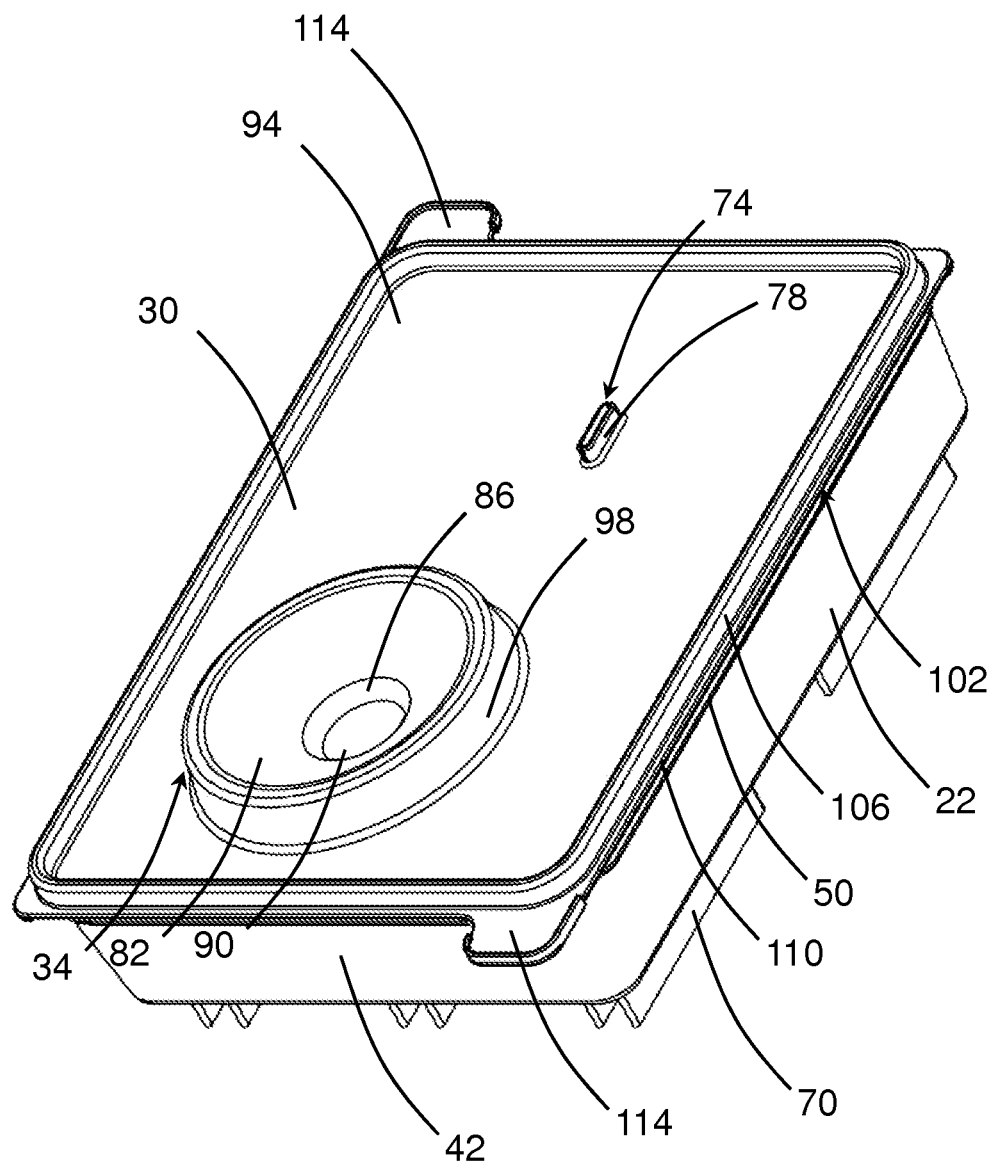

Referring now to FIGS. 17 and 18, front and perspective views of the tray 22 and lid 30 are shown. The lid 30 is attached to the tray 22 by pressing the channel 102 onto the upper sealing edge 46. The channel 102 engages the upper sealing edge 46 to secure the lid 30 to the tray 22 and to prevent liquid from spilling out of the sides of the tray 22.

Referring back to FIG. 1, a tray 22 may be filled with etching fixtures 10 or parts to be etched and the lid 30 may be assembled onto the tray. Acid 26 may then be poured into the tray 22 through the funnel 34. The upper section 82 of the funnel provides a large opening to ensure that the acid 26 enters the tray 22. The acid moves through the neck 90 and into the tray. The length of the neck 90 provides minimal distance between the bottom of the neck 90 and the tray bottom surface 40, minimizing splashes. The small lower opening of the neck 90 also helps to keep any acid splashes in the tray 22. The funnel 34 provides a small opening into the tray 22 and helps to keep acid vapors in the tray. If the tray 22 is filled with acid 26 sufficiently that the acid 26 reaches the bottom of the funnel 34, the surface of the acid 26 outside of the funnel 34 is separated from the funnel opening and the vapor space above most of the acid is sealed while still allowing easy access to the tray 22 to check the acid level and replenish the acid if necessary. Thus, the bottom opening of the funnel neck 90 may be located slightly below the operating acid level for the tray 22. The spacer wall 58 spaces fixtures 10 apart from the funnel neck 90 a small distance. The openings 66 in the spacer wall 58 allows acid to move through the spacer wall 58.

Referring back to FIG. 2, the float assembly 38 may include a float 118 and a stem 122. The float 118 has a lower density than the acid and will float at least partially above the acid 26. The stem 122 extends up from the float 118 and passes through the opening 74 in the lid 30. The stem 122 and opening 74 keep the float 118 in a desired position within the tray 22. The spacer wall 58 keeps fixtures 10 away from the float assembly 38 so that the fixtures do not interfere with the operation of the float assembly 38. If desired, the spacer wall 58 may be of sufficient height to extend around the float 118 and assist in keeping the float 118 in a desired position. The stem 122 may have a series of holes 126 or other markings formed therein to assist a user in judging the acid level by looking at the stem.

The etching system provides many benefits. The tray 22 and lid 30 allow a person to easily load fixtures 10 for etching, close the lid 30, and place the tray 22 in a final position before filling the tray with acid 26. The risk of acid spills or burns is significantly reduced. The lid 30 provides for good control of the acid and acid vapors without interfering with the etching process. The lid 30 allows the acid level to be checked and allows additional acid to be added without removing the lid and typically without requiring contact with the tray 22 and lid 30. The tray 22 and lid 30 allow the etching process to be well controlled and monitored with a minimum of risk or exposure.

There is thus disclosed an improved etching system for etching PCD cutting inserts. The above description of illustrated examples of the present invention, including what is described in the Abstract, are not intended to be exhaustive or to be limitation to the precise forms disclosed. While specific embodiments of, and examples for, the invention are described herein for illustrative purposes, various changes may be made to the present invention without departing from the scope of the claims.

What is claimed is:

1. An etching system for etching cutting inserts comprising:
   a tray having a bottom, side walls extending upwardly from the tray bottom, and an upper sealing edge;
   a unitarily formed lid and funnel attached to the tray upper sealing edge;
   wherein the funnel is formed as a unitary part of the lid, the funnel having an upper opening and a neck extending downwardly into the tray and having a lower opening to allow placement of liquid in the tray; and
   an etching fixture disposed in the tray, the etching fixture having a body which holds a cutting insert to expose the cutting insert for etching; and
   wherein the system comprises a plurality of etching fixtures disposed in the tray, and wherein the tray comprises a spacer wall which is aligned below the funnel lower opening and which extends upwardly from the bottom of the tray towards the funnel lower opening and prevents the etching fixtures from moving beneath the funnel lower opening.

2. The system of claim 1, wherein the funnel comprises a broad upper section and a narrow neck extending downwardly from the upper section.

3. An etching system comprising:
a tray having a bottom, side walls extending upwardly from the tray bottom, and an upper sealing edge;
a lid having a funnel as part thereof, wherein the lid is attached to the tray upper sealing edge;
wherein the funnel has an upper opening and a neck extending downwardly into the tray and having a lower opening to allow placement of liquid in the tray; and
an etching fixture disposed in the tray;
wherein the tray comprises a spacer wall which is aligned below the funnel, and wherein the spacer wall extends around the lower opening of the funnel upwardly from the tray bottom and prevents etching fixtures from occupying a space beneath the funnel lower opening.

4. The system of claim 3, wherein the spacer wall comprises an upper opening disposed adjacent the funnel lower opening and wherein the spacer wall has openings formed therethrough.

5. The system of claim 1, further comprising a float disposed in the tray to indicate a liquid level in the tray, and wherein the float extends through the lid.

6. The system of claim 5, wherein the float has a stem extending upwardly from the float and wherein the stem passes through an opening in the lid.

7. The system of claim 1, further comprising a cutting insert disposed in the etching fixture.

8. An etching system comprising:
a tray having a bottom, side walls extending upwardly from the tray bottom, and an upper sealing edge;
a lid having a funnel as part thereof, wherein the lid is attached to the tray upper sealing edge;
wherein the funnel has an upper opening and a neck extending downwardly into the tray and having a lower opening to allow placement of liquid in the tray; and
an etching fixture disposed in the tray;
acid in the tray; and
wherein the funnel lower opening is maintained beneath an upper surface of the acid; and
wherein the system comprises a plurality of etching fixtures disposed in the tray, and wherein the tray comprises a spacer wall which is aligned below the funnel lower opening and which extends upwardly from the bottom of the tray towards the funnel lower opening and prevents the etching fixtures from moving beneath the funnel lower opening.

9. An etching system for etching cutting inserts comprising:
a tray having a bottom and having side walls extending upwardly from the tray bottom;
a unitarily formed lid and funnel, wherein the lid is attached to the tray side walls to close the tray;
wherein the unitarily formed funnel comprises an upper opening which is formed as part of the lid and a neck which extends downwardly from the lid and into the tray, the neck defining a lower opening to allow placement of liquid in the tray through the funnel; and
wherein the system comprises acid disposed in the tray and wherein the lower opening of the funnel is maintained beneath an upper surface of the acid; and
wherein the system comprises a plurality of etching fixtures disposed in the tray, and wherein the tray comprises a spacer wall which is aligned below the funnel lower opening and which extends upwardly from the bottom of the tray towards the funnel lower opening and prevents the etching fixtures from moving beneath the funnel lower opening.

10. The system of claim 1, wherein the lid further comprises a wall extending upwardly from an upper surface of the lid above the upper surface of the lid, the wall having a shape corresponding to the funnel upper opening, wherein a bottom of the wall is attached to the lid and wherein a top of the wall is attached to the funnel upper opening such that the upper opening of the funnel is located a distance above the upper surface of the lid.

11. The system of claim 1, wherein the system comprises a plurality of etching fixtures located in the tray and wherein the tray comprises a spacer wall located below the funnel and aligned with the funnel lower opening, wherein the spacer wall encloses an area of the tray beneath the funnel lower opening, and wherein the spacer wall extends upwardly from the tray bottom to prevent the plurality of etching fixtures from moving beneath the funnel lower opening.

12. The system of claim 11, wherein the spacer wall has openings formed therethrough.

13. The system of claim 1, further comprising a float disposed in the tray to indicate a liquid level in the tray, and wherein an upper portion of the float extends through an opening in the lid.

14. The system of claim 13, wherein the system comprises a plurality of etching fixtures disposed in the tray, and wherein the tray comprises a wall which is aligned below the float, wherein the wall encloses an area of the tray beneath the float and wherein the wall extends upwardly from the tray bottom to prevent the plurality of etching fixtures from moving beneath the float.

15. The system of claim 1, further comprising a cutting insert disposed in the tray.

* * * * *